United States Patent
Desplats et al.

(10) Patent No.: US 7,411,391 B2
(45) Date of Patent: Aug. 12, 2008

(54) MAGNETIC-FIELD-MEASURING PROBE

(75) Inventors: Romain Desplats, Toulouse (FR);
Olivier Crepel, Mondeville (FR); Félix Beaudoin, Baziege (FR); Philippe Perdu, Toulouse (FR)

(73) Assignee: Centre National d'Etudes Spatiales, Paris (FR)

( * ) Notice: Subject to any disclaimer, the term of this patent is extended or adjusted under 35 U.S.C. 154(b) by 0 days.

(21) Appl. No.: 10/575,234

(22) PCT Filed: Oct. 8, 2004

(86) PCT No.: PCT/FR2004/002562

§ 371 (c)(1),
(2), (4) Date: Jun. 22, 2006

(87) PCT Pub. No.: WO2005/036194

PCT Pub. Date: Apr. 21, 2005

(65) Prior Publication Data
US 2007/0132464 A1   Jun. 14, 2007

(30) Foreign Application Priority Data
Oct. 8, 2003 (FR) .................................. 03 11772

(51) Int. Cl.
*G01R 33/02* (2006.01)
*G01R 33/06* (2006.01)
(52) U.S. Cl. ............... 324/252; 324/207.21; 324/207.2; 324/249; 324/260
(58) Field of Classification Search ................. 324/249, 324/247, 244, 207.15, 207.2, 251, 252, 117 R, 324/117 H, 260, 262
See application file for complete search history.

(56) References Cited

U.S. PATENT DOCUMENTS

| 5,132,620 A | 7/1992 | Rempt |
| 5,519,318 A * | 5/1996 | Koerner et al. ............... 324/252 |
| 6,124,712 A | 9/2000 | Chaiken |
| 6,427,314 B1 | 8/2002 | Acker |
| 2002/0167313 A1 | 11/2002 | Taimisto |

FOREIGN PATENT DOCUMENTS

WO    WO 98/38792    9/1998

* cited by examiner

*Primary Examiner*—Reena Aurora
(74) *Attorney, Agent, or Firm*—Young & Thompson (57) ABSTRACT

A magnetic-field-measuring probe includes at least one magnetoresistive or magnetoinductive sensor which is sensitive to the magnetic field along a privileged measurement axis. The probe includes: at least two magnetoresistive or magnetoinductive sensors (14, 16) which are rigidly connected to one another in a position such that the privileged measurement axes thereof are parallel and offset in relation to one another in a direction that is transverse to the privileged measurement axes; and output terminals specific to each magnetoresistive or magnetoinductive sensor, in order to supply a signal that is representative of the magnetic field measured by each sensor along the privileged measurement axis thereof.

14 Claims, 8 Drawing Sheets

MAGNETIC-FIELD-MEASURING PROBE

BACKGROUND OF THE INVENTION

1. Field of the Invention

The present invention relates to a probe for measuring a magnetic field comprising at least one magnetoresistive or magnetoinductive sensor which is sensitive to the magnetic field along a selected measurement axis.

2. Description of the Related Art

It is envisaged to measure the magnetic field produced by an electronic circuit during operation by using a magnetoresistive sensor and, more precisely, a sensor of the GMR type (Giant Magneto Resistor) or TMR type (Tunneling Magneto Resistance). These are known as MTJ (Magnetic Tunnel Junction) and SDT (Spin Dependent Tunneling).

Magnetoresistive sensors of this type are electronic elements whose resistance varies in accordance with the magnetic field in which they are placed.

In installations which are currently known, the magnetoresistive sensor placed above the electronic circuit to be analysed is connected to a processing chain.

The magnetoresistive sensor thus allows a value to be obtained which is representative of the magnetic field produced at one point by the electronic circuit during operation. A probe of this type does not allow the circuit to be characterised precisely and in particular does not allow the structure of the circuit to be determined in a precise manner, and in particular the position of the tracks which it comprises.

BRIEF SUMMARY OF THE INVENTION

The object of the invention is to provide a measurement probe which allows other information relating to the circuit to be obtained in addition to the magnetic field produced by a circuit.

To this end, the invention relates to a probe for measuring a magnetic field of the above-mentioned type, characterised in that it comprises at least two magnetoresistive or magnetoinductive sensors which are rigidly connected to each other in a position such that their selected measurement axes are parallel and offset relative to each other in a transverse direction relative to their selected measurement axes, and in that the probe comprises output terminals which are specific to each magnetoresistive or magnetoinductive sensor in order to provide a signal which is representative of the magnetic field measured by each sensor along the selected measurement axis thereof.

According to specific embodiments, the measurement probe comprises one or more of the following features:

- it comprises at least two pairs of magnetoresistive or magnetoinductive sensors, the sensors of each same pair having their selected measurement axes parallel and offset relative to each other in a transverse direction relative to their selected measurement axes and the selected measurement axes of the sensors of two separate pairs are angularly offset;
- it comprises at least nine magnetoresistive or magnetoinductive sensors which are distributed in three triplets of three sensors, the three sensors of the same triplet having their selected measurement axes parallel and offset relative to each other in transverse directions relative to their selected measurement axes and the selected measurement axes of the sensors of separate triplets are angularly offset;
- all the magnetoresistive or magnetoinductive sensors of the probe are distributed in accordance with two layers;
- the selected measurement axes of the sensors of different layers are angularly offset;
- the sensors of the same layer have their selected measurement axes parallel;
- all the magnetoresistive or magnetoinductive sensors of the probe are distributed on the same layer.

The invention further relates to a device for analysing an electrical circuit during operation, comprising at least one probe as defined above, a processing chain which is specific to each magnetoresistive or magnetoinductive sensor and means for processing the signals from the various processing chains, which processing means are suitable for evaluating the ratio of the difference between the field values measured by two magnetoresistive or magnetoinductive sensors having selected measurement axes which are parallel and which are offset transversely relative to each other at the distance separating the two magnetoresistive or magnetoinductive sensors.

In a variant:

- it comprises means for displaying the ratio of the difference between the field values measured by two magnetoresistive or magnetoinductive sensors having selected measurement axes which are parallel and which are offset transversely at the distance separating the two magnetoresistive or magnetoinductive sensors, and in that the device is suitable for being held by hand and manually displaced;
- a device for analysing a magnetic field provided with a sensor in which the processing means are capable of evaluating, for each pair of sensors, the ratio of the difference between the field values measured by two magnetoresistive or magnetoinductive sensors having selected measurement axes which are parallel and which are offset transversely at the distance separating the two magnetoresistive or magnetoinductive sensors and the processing means are capable of calculating at least one component of the current from the difference between the evaluated ratios; and
- it comprises means for displaying at least one calculated component of the current and the device is suitable for being held by hand and manually displaced.

BRIEF DESCRIPTION OF THE DRAWING FIGURES

The invention will be better understood from a reading of the following description, given purely by way of example and with reference to the appended drawings, in which.

DETAILED DESCRIPTION OF THE PREFERRED EMBODIMENTS

Figure 1:
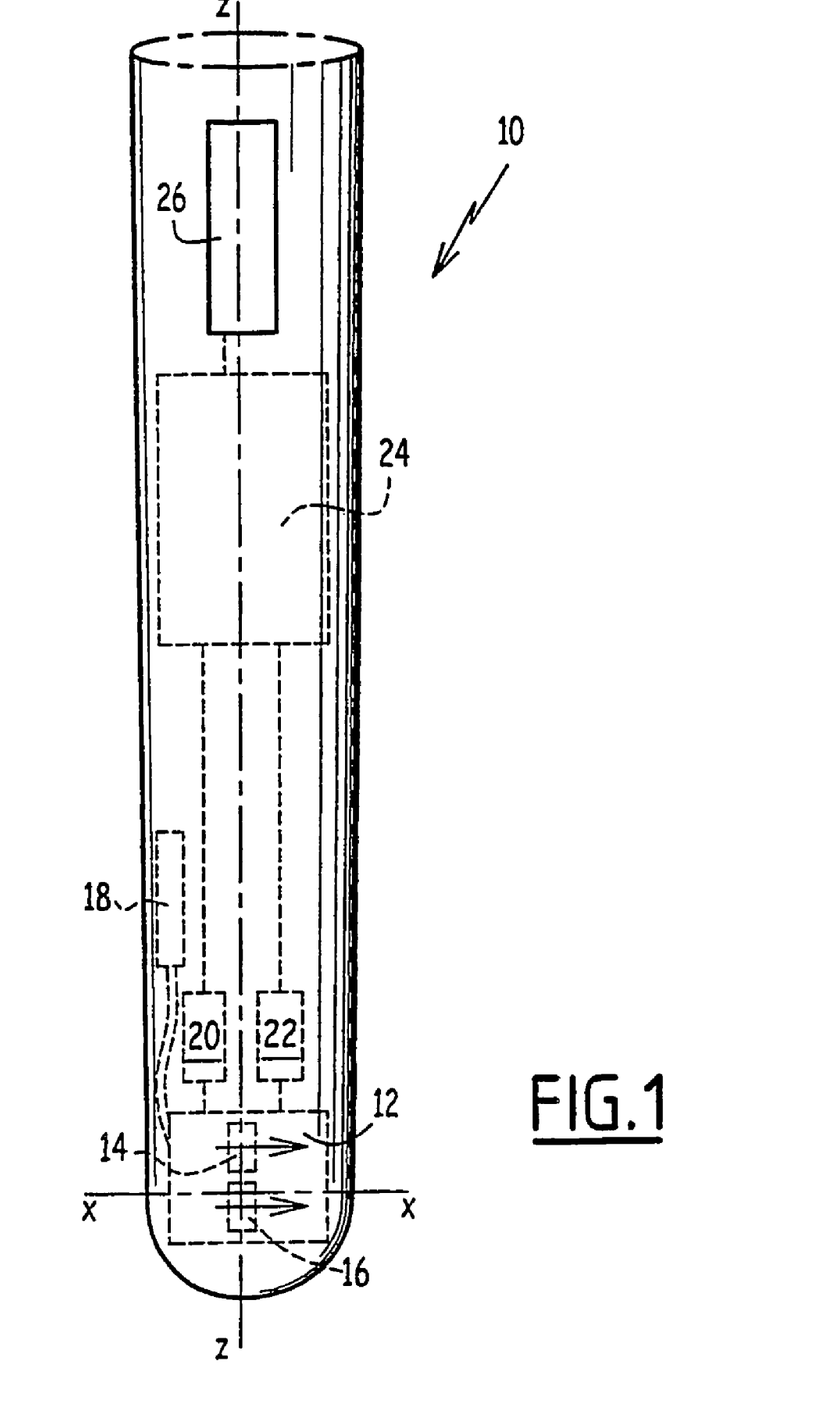
FIG. 1 is a perspective view of a portable device for analysing an integrated circuit.

FIG. 1 illustrates a portable device for measuring the current flowing in a circuit in a single direction.

The device is in the form of an elongate implement having an axis Z-Z whose shape and dimensions generally correspond to those of a pen. It is therefore suitable for being manually displaced above a circuit with the axis Z-Z perpendicular relative to the plane of the circuit.

The device comprises, at one end, a probe 12 which comprises two magnetoresistive sensors 14, 16 which are arranged in two parallel planes perpendicular relative to the axis Z-Z. In the drawings, the two sensors are arranged successively along the axis Z-Z. In practice, they are advantageously slightly offset transversely at one side and the other of the axis Z-Z in order to prevent potential problems of magnetic screening.

The structure of the probe 12 will be set out in detail with reference to the following figures.

Each magnetoresistive sensor has a selected measurement axis which is indicated schematically by an arrow. The resistance of the sensor is substantially influenced by the component of the magnetic field along this selected measurement axis.

According to the invention, the selected measurement axes of the two sensors 14, 16 are parallel with each other. In the example in question, these axes extend parallel with the axis X-X of the device and are perpendicular relative to the longitudinal axis Z-Z of the device.

The device 10 comprises means 18 for supplying the two sensors. These means will be described in detail with reference to the following figures.

In the same manner, the probe 12 comprises output terminals which are specific to each sensor 14, 16 and which allow a signal to be received which is representative of the magnetic field measured by this sensor.

Each sensor 14, 16 is connected to a specific processing chain 20, 22 which allows the signal from the sensor to be processed. These processing chains are connected to a data processing unit 24 which is capable of processing the signals which are representative of the components of the magnetic field obtained at the output of the processing chains 20, 22. The device further comprises a display screen 26 which is controlled by the data processing unit 24.

The screen 26 is capable of displaying the value of the derivative designated $$\frac{dB_x}{dz}$$

of the component of the magnetic field B along the axis X-X of the device relative to the longitudinal direction Z-Z which extends via the two sensors 14, 16.

The device 10 according to the invention operates in the following manner. At the output of the processing chains, two values of the component of the magnetic field B in the direction X-X are obtained, designated $B_{x1}$ and $B_{x2}$. They correspond to the field at the location of the sensors 14 and 16. Based on these two measurement values and the known distance separating the sensors 14 and 16 measured along the axis Z-Z, the data processing unit 24 determines an evaluation of the derivative $$\frac{B_x}{dz}$$

of the component of the magnetic field in the direction X-X relative to the direction Z-Z based on the ratio $$\frac{dB_x}{dz} = \frac{B_{x2} - B_{x1}}{z_2 - z_1}$$

where $z_2$ and $z_1$ are the positions of the sensors 14 and 12 along the axis Z-Z.

The value of the current designated $j_y$ flowing in the circuit in the direction Y-Y which is perpendicular relative to the two directions X-X and Z-Z is equal to $$\frac{dB_x}{dz}$$

so that the value calculated by the data processing unit 24 is this current value. This current value is displayed on the screen 26.

Figure 2:
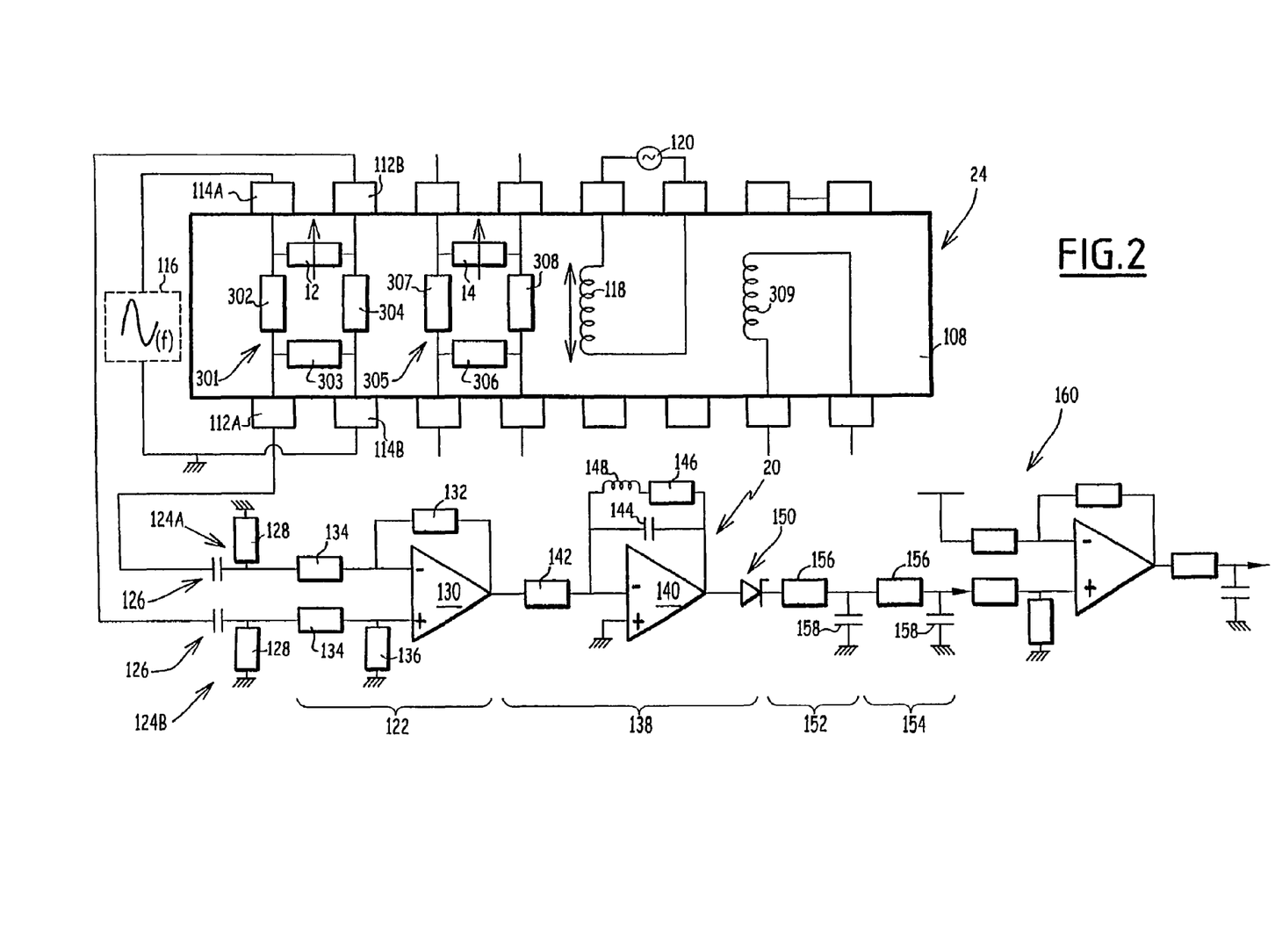
FIG. 2 is a schematic view of a first embodiment of a device for measuring a magnetic field according to the invention.

In FIG. 2, only the integrated circuit 108 comprising the sensors 12 and 14 is illustrated. Furthermore, only the processing circuit 20 associated with the sensor 12 is illustrated since an identical processing circuit is used for the sensor 14.

As illustrated in FIG. 2, the magnetoresistive sensor 12 is integrated in a Weston bridge 201 which comprises three other fixed resistors 302, 303, 304 having a predetermined value. The four resistors are connected in series in order to form a loop, as known per se in the structure of a Weston bridge. Two of the opposing terminals of the Weston bridge form measurement outputs 112A, 112B of the probe 100. The other two terminals 114A, 114B of the Weston bridge form power supply inputs for the Weston bridge. They are connected to the terminals of a generator 116 which produces a sinusoidal signal of a predetermined frequency, this frequency being, for example, equal to 160 kHz.

Furthermore, and as known per se, the measurement probe comprises a winding 118 which is connected to an external source 120 of alternating voltage. The winding 118 is suitable for creating a polarisation field in the region of the magnetoresistive sensor in order to reduce the hysteresis of the sensor.

In the same manner, the magnetoresistive sensor 14 is also integrated in a Weston bridge 305 which comprises three resistors 306, 307, 308 and a second winding 309 is provided in order to create a polarisation field in the region of the magnetoresistive sensor 14 in order to reduce the hysteresis. As above, the Weston bridge and the winding are connected to specific supply means which are not illustrated for reasons of simplification.

Only the circuit for processing the signals from the magnetoresistive sensor 12 is described below since the circuit connected to the sensors 14 is identical.

The outputs 112A, 112B of the measurement probe are connected to the processing chain 20.

They are connected, at the input, to a differential amplification stage 122 which forms a subtracter by means of two high-pass filters 124A, 124B, to the inputs of which the output terminals 112A and 112B are connected, respectively.

The differential amplification stage 122 is configured so as to produce a gain, for example, equal to 100.

The high-pass filters are passive filters of the RC type which comprise a capacitor 126, one terminal of which is connected to earth by means of a resistor 128.

The differential amplification stage is of any suitable known type and comprises, for example, an operational amplifier 130 whose feedback loop is provided with a resistor 132, the inverting and non-inverting inputs of the operational amplifier-being connected to the outputs of the filters 124A, 124B by means of two input resistors 134. The non-inverting terminal of the operational amplifier is connected to earth by means of a resistor 136 which fixes an input voltage.

The output of the differential amplifier 120 is connected to the input of means 138 for isolating a predetermined frequency component of the signal which is representative of the magnetic field from the measurement probe. The frequency of the field component to be determined is designated FI. This frequency is, for example, equal to 160 kHz.

In the embodiment illustrated in FIG. 2, these isolation means 138 comprise an active selective filter of the band-pass type centred on the frequency FI of the frequency component to be isolated. This frequency is equal to the excitation frequency F of the circuit C.

This filter comprises an operational amplifier 140 whose non-inverting terminal is connected to earth. The inverting terminal of the filter is connected to the output of the differential amplification stage 122 by means of an input resistor 142. The feedback loop of the differential amplifier 140 comprises a capacitor 144 which is connected in parallel to a resistor 146, which is itself connected in series to a coil 148.

At the output, the selective filter 138 has a diode 150 of the BAT type followed by two passive low-pass filters 152, 154 which are each formed by a resistor whose output terminal is connected to earth by means of a capacitor 158.

The processing chain 20 allows the frequency component of the magnetic field detected by the magnetoresistive sensor to be obtained using a very simple circuit.

During operation of the device for measuring the magnetic field, the resistance value of the magnetoresistive sensor 12 varies in accordance with the magnitude of the magnetic field along the selected measurement axis of the sensor. The amplitude of the signal measured at the output terminals 112A, 112B thus varies in accordance with the magnetic field.

The two high-pass filters 124A, 124B bring about filtering of the interfering frequencies resulting from the external environment.

The differential amplification circuit 122 produces at the output a signal whose magnitude is proportional to the potential difference between the two terminals 122A, 122B. The selective filter 138 centred on the excitation frequency of the circuit C brings about the isolation of the frequency component of the field for this frequency.

The two low-pass filters 152, 154 bring about a new filtering operation which allows the interfering components to be suppressed.

An output step 160 can advantageously be added so as to output the continuous voltage value measured at the terminal of the non-loaded sensor. To this end, a differential amplifier is used again. The preceding output signal is applied to the inverting input of the differential amplifier whilst the continuous reference voltage is applied to the non-inverting input.

Control of the reference voltage is carried out by adjusting the value of the adjustable resistance so as to measure a zero value at the output of this second differential amplifier. The measurement is carried out by polarising the sensor magnetically (in order to offset in the hysteresis cycle) without polarising the circuit C.

The signal from the processing chain is received by the data processing unit.

In this manner, it will be understood that the processing chain allows a measurement value of the magnetic field and, more precisely, a component of the magnetic field to be obtained very quickly.

Figure 3:
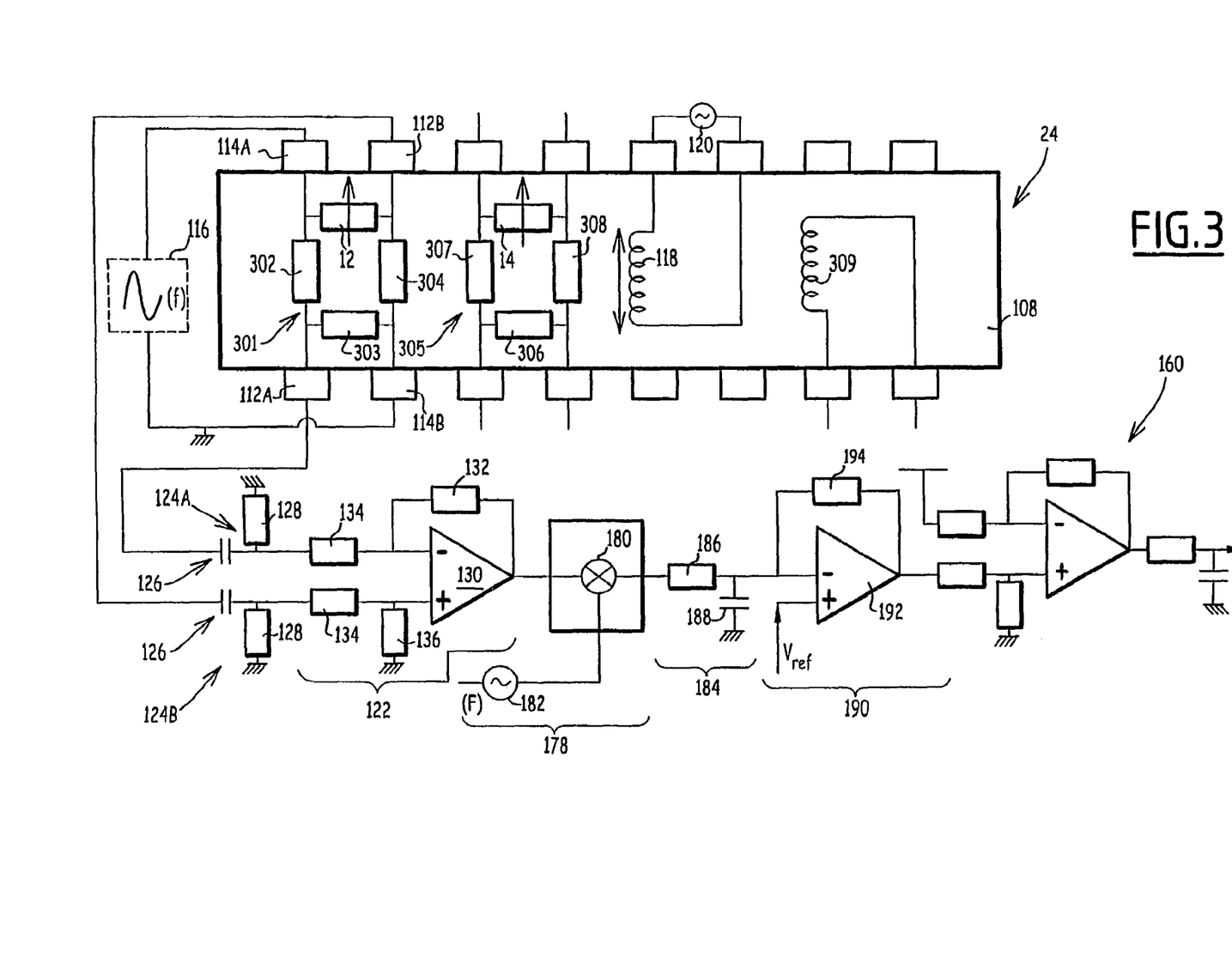
FIGS. 3 and 4 are views identical to that of FIG. 2 of construction variants of a measurement device.
Figure 4:
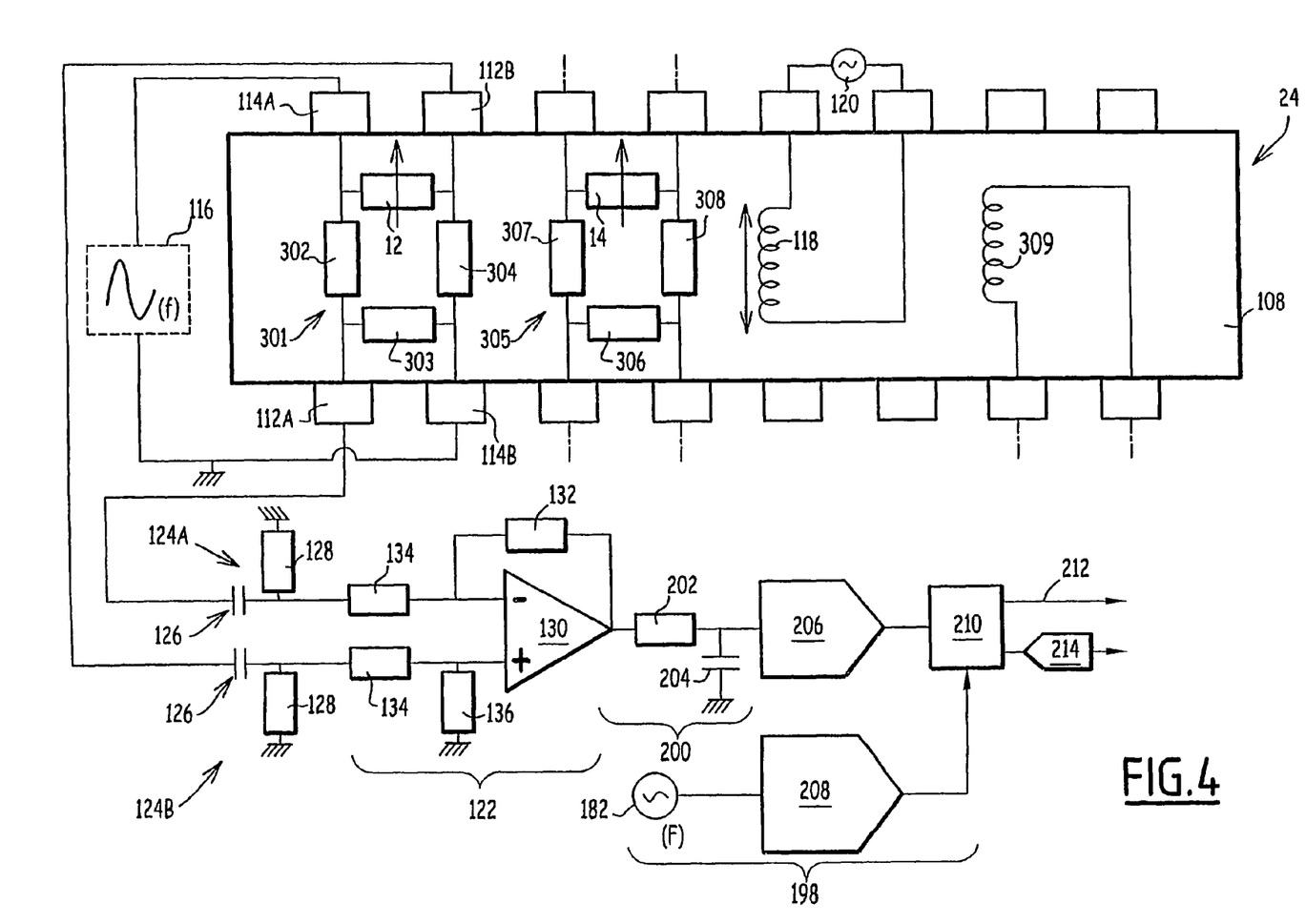

FIGS. 3 and 4 illustrate construction variants of a measurement device according to the invention. In these embodiments, elements which are identical or similar to those of FIG. 2 are indicated with the same reference numerals.

In these two construction variants, only the processing chain differs, owing to the means used downstream of the differential amplification stage 122.

In the two cases, the means for isolating the frequency component of the magnetic field for a predetermined frequency comprise a multiplication circuit 180 which allows the signal from the differential amplification stage 122 and a reference signal to be combined whose frequency FC is greater than or equal to the circuit operating frequency f imposed by an excitation circuit. The use of the multiplier provides flexibility with regard to the selection of the frequency (160 kHz).

In the embodiment of FIG. 3, the isolation means comprise an analogue multiplication circuit 180, one input of which is connected at the output of the differential amplification stage 122, and the other input of which is connected to a sinusoidal voltage generator 182 whose reference frequency F is greater than the predetermined frequency FI of the frequency component to be isolated.

A low-pass filter 184 constituted by a resistor 186 and a capacitor 188 is provided at the output of the multiplication circuit. Advantageously, a subtraction circuit 190 is provided at the output of the low-pass filter 184 in order to bring about the comparison of the filtered signal obtained at the output with an imposed reference signal designated Vref. The subtraction circuit comprises an operational amplifier 192 whose feedback loop has a suitable resistor 194, and to the non-inverting terminal of which a voltage Vref is applied.

As in the embodiment of FIG. 2, an output stage 160 is arranged at the output of the subtraction circuit.

According to a specific embodiment, the voltage source 182 is formed by the voltage source 116 which supplies the Weston bridge 201.

In this embodiment, the power supply frequency of the sensor is identical to the frequency of the frequency component sought.

Figures 5, 6:
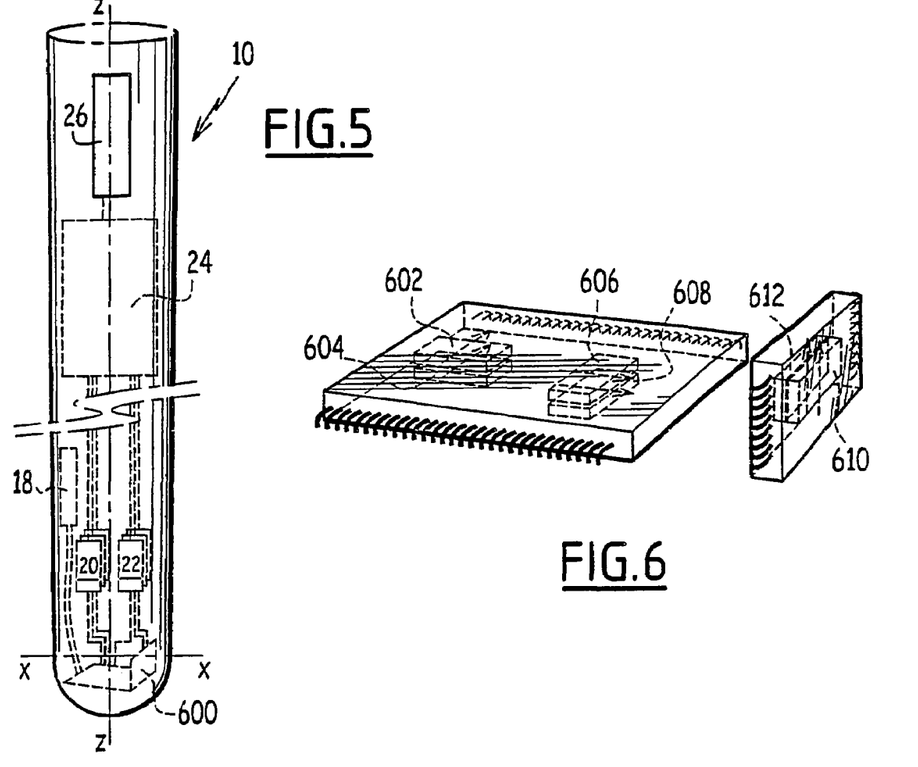
FIG. 5 is a perspective schematic view of a construction variant of a probe according to the invention.
FIG. 6 is a perspective view of an installation.

In the embodiment of FIG. 6, the means for isolating the predetermined frequency component are formed by a digital processor which brings about the multiplication of the signal obtained at the output of the differential amplification stage 122 and a reference signal.

As illustrated in FIG. 4, a low-pass filter 200 constituted by a resistor 202 and a capacitor 204 is provided at the output of the differential amplification stage. An analogue/digital convertor 206 is connected at the output of the filter 200 in order to ensure that the signal is digitised.

Furthermore, the processing chain includes, as above, a sinusoidal reference voltage source which is also designated 182. An analogue/digital convertor 208 is connected at the output of this source 182. The analogue/digital convertors have a sampling frequency which is far greater than the frequency of the signals received. This is, for example, greater than 500 kHz.

A high-speed processor 210, such as a circuit of the DSP type, is provided in the processing chain. It receives at the input the signals from the two analogue/digital convertors 206 and 208 and is programmed to bring about a multiplication of the two signals.

The multiplied signals are thus sent to the data processing unit 24.

In this case, the multiplication of the two signals is carried out by the processor 210. The subtraction operation carried out by the output stage 160 in FIGS. 3 and 4 is also brought about by the processor 210.

FIG. 5 illustrates a construction variant of a device according to the invention. In this Figure, elements which are identical or similar to those of FIG. 1 are indicated by the same reference numerals.

In this embodiment, the probe which is designated 600 and which is illustrated at a larger scale in FIG. 6 comprises six magnetoresistive sensors which are distributed in three pairs of sensors, the sensors of the same pair having their selected measurement axes parallel with each other. The selected measurement axes of the three sensor pairs are perpendicular relative to each other and thus extend in three main spatial directions.

The sensors of the same pair are offset relative to each other in a transverse direction relative to their common selected measurement axes.

In this embodiment, four sensors 602, 604, 606, 608 are arranged on a first integrated circuit, whilst two other sensors 610, 612 are arranged on another integrated circuit which is arranged perpendicularly relative to the first.

The sensors 602, 604, 606, 608 are distributed along two parallel planes.

As in the embodiment of FIG. 1, the sensors 602 and 604 are offset along the axis Z-Z whilst their selected measurement axes extend along the axis X-X. In the same manner, the sensors 606, 608 are offset along the axis Z-Z but their selected measurement axes extend along the axis Y-Y which is perpendicular relative to the axes X-X and Z-Z.

Finally, the sensors 610 and 612 are offset along the axis X-X, their selected measurement axes being parallel with the axis Z-Z.

As illustrated schematically in FIG. 5, each sensor is associated with a specific processing chain 20, 22 of the measurement device, the outputs of the six processing chains being connected to the data processing unit 24 of the device.

In this embodiment, the data processing unit 24 is suitable for calculating the values of the variation of the component of the magnetic field in each of the directions X-X, Y-Y and Z-Z.

Each variation, designated $dB_x$, $dB_y$ and $dB_z$, respectively, is defined as the difference between the field measurements carried out between the two sensors of the same pair.

Furthermore, the data processing unit 24 provides a calculation of the modulus of the field variation, this modulus being determined by $$|dB| = \sqrt{dB_x^2 + dB_y^2 + dB_z^2}.$$

The use of two planes of two sensors in the directions X-X and Y-Y allows current to be sought in the plane perpendicular relative to the axis Z-Z of the device. The differential field measurements-between the sensors in pairs: $dB_x/dz$ and $dB_y/dz$ make it possible to derive the vectorial expression of the current with Maxwell's equations: Jx and Jy since $dBz/dy$ and $dBz/dx$ are zero if the current flows only in the plane perpendicular relative to the axis of the device.

Figure 7:
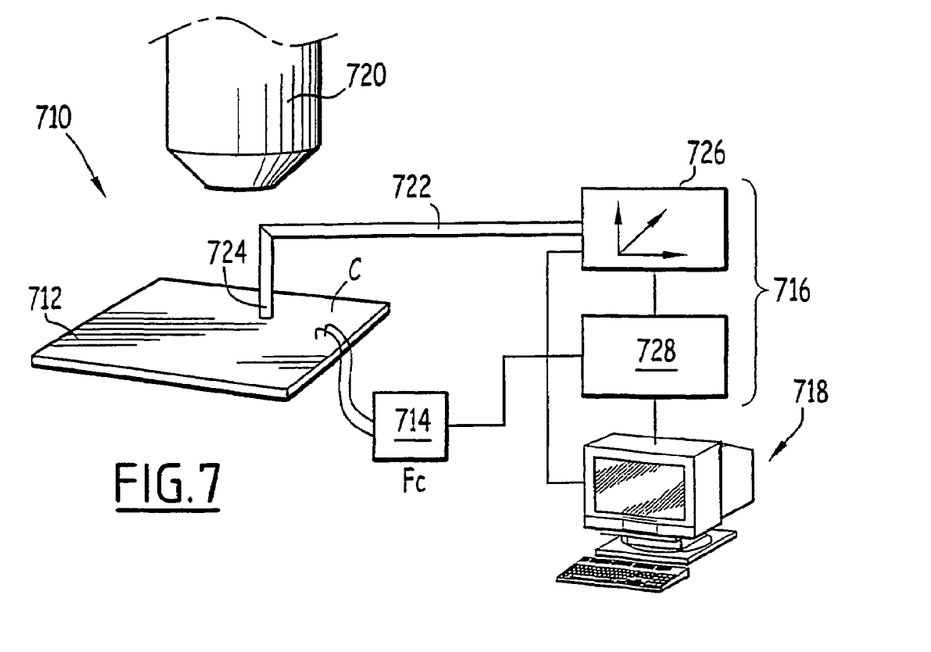
FIG. 7 is a perspective view of an installation for analysing an integrated circuit.

The installation 710 illustrated in FIG. 7 is intended for the analysis of an integrated circuit during operation.

This installation substantially comprises a plate 712 for supporting an integrated circuit C, a circuit 714 for exciting the integrated circuit at a predetermined frequency designated FC, a device 716 for analysing the magnetic field produced by the circuit C during operation and means 718 for processing the results obtained at the output of the device 716 for analysing the magnetic field. Furthermore, the installation comprises means 720 for observing the integrated circuit during operation. These means are known per se and will not be described in detail.

The support 712 on which the circuit C is placed is formed by a plate of mumetal or comprises in the lower portion thereof remote from the circuit, a plate of mumetal which forms a barrier to the magnetic field. Advantageously, the circuit C is confined in a case of mumetal.

The excitation circuit 714 is formed, for example, by a frequency generator which is capable of supplying the circuit with power at the predetermined frequency FC. This excitation frequency FC is, for example, 160 kHz.

The analysis means 716 comprise a manipulating arm 722 which is provided, at the free end thereof, with a measurement probe 724 which is capable of determining a value which is characteristic of the magnetic field at the location of the probe.

The manipulating arm 722 is connected to a mechanism 726 for displacing the probe which, as known per se, allows the probe to be displaced in three directions which are perpendicular relative to each other and allows the position of the probe relative to the circuit to be known in a precise manner.

Furthermore, the analysis means 716 comprise processing chains 728 to which the probe 724 is connected in order to process the signal from the probe. These processing chains are identical to those described with reference to FIGS. 2, 3 and 4. They are connected to the processing means 718 to provide the means with one or more processed values of the magnetic field measured by the probe 724.

The processing means 718 are formed, for example, by a computer of the PC type which comprises input cards which are connected at the output of the processing chains 728. It further comprises control cards which allow the analysis means 716, and more precisely the displacement means 726, the processing chain 728 and the excitation circuit 714 to be controlled.

The processing means 718 comprise software modules which allow the means 716 for analysing the magnetic field, and in particular the excitation circuit 714, the displacement means 726 and the processing chains 728 to be controlled. They further comprise software modules for processing the signals from the field analysis means.

Figure 8:
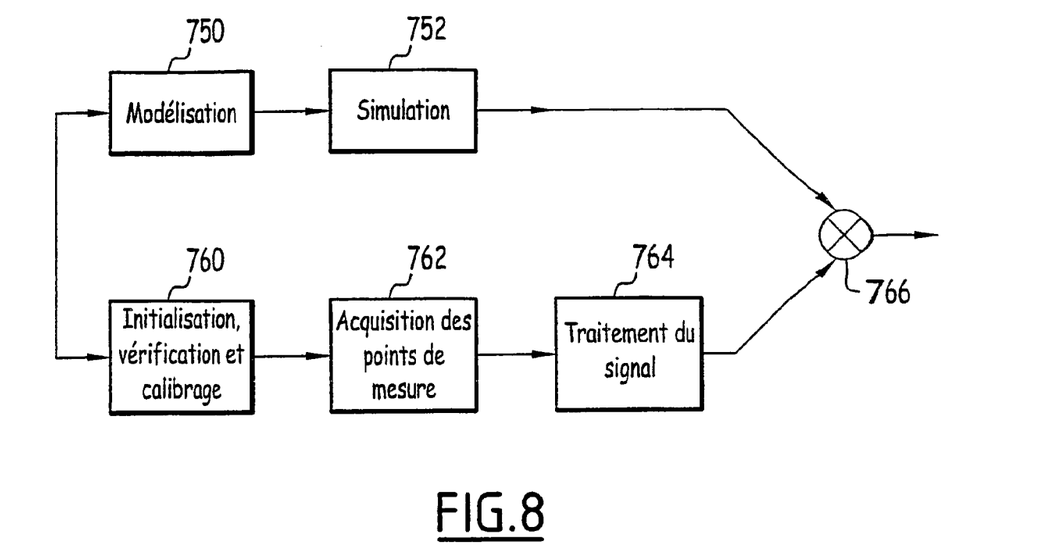
FIG. 8 is a flow chart explaining the operation of the installation of FIG. 7.

In particular, the processing means 718 are capable of implementing the algorithm illustrated in FIG. 8, a software module being provided for each step of the algorithm.

In order to analyse an electronic circuit during operation, a modelling of the circuit can first be carried out during step 750, based on the schematic representation of the circuit. This modelling, which is, for example, vectorial, is carried out using any appropriate software means. This modelling is intended to determine the position of the various tracks and various electronic components which constitute the circuit C.

When this modelling is complete, a simulation of the operation of the circuit is carried out during step 752. The characteristics of the magnetic field above the circuit are determined by this simulation, at each point of the circuit, in particular by applying Maxwell's equations. In this manner, for each element of the circuit, the current which is flowing therein, and the three components of the magnetic field designated $B_x$, $B_y$, and $B_z$ are determined, at a measurement point which is located immediately above the circuit and for different predetermined positions which can be occupied by the measurement probe 724.

In parallel with the modelling and simulation steps, the processing means 718 control effective measurement of the magnetic field using the field analysis means 716 at each relevant measurement point during the simulation.

During step 760, the field analysis means 716 are first initialised and calibrated. Their correct operation is also verified. Furthermore, reference measurements are carried out on a known calibration test-piece whose components of the magnetic field which it produces are known.

An acquisition of the various measurement points is then carried out during step 762. This step involves carrying out a measurement of at least one component of the magnetic field at several predetermined measurement points above the circuit C during operation. To this end, the probe is displaced under the control of the displacement means 726 in order to scan the surface of the circuit, for example, by following a boustrophedon type path. Before each acquisition of a measurement, the measurement probe is stopped at the measurement point so that the result of the measurement is not affected by the displacement of the probe.

The actual acquisition of each measurement will be described below.

Advantageously, but not necessarily, step 762 also provides for the acquisition of measurement points when the circuit C is not operational in order to measure at each measurement point the components(s) of the ambient magnetic field.

During step 764, the signal acquired for each measurement point is processed in order in particular to correct the errors and discrepancies resulting from the measurement, these errors and discrepancies being corrected by means of techniques involving comparison with the table of data acquired from a reference test-piece during step 760.

During step 764, values from the field measurements in one or more directions designated $B_x$, $B_y$, $B_z$ are calculated and in particular the spatial variations of the field components in the three directions designated $dB_x/dy$, $dB_x/dz$, $dB_y/dz$, $dB_y/dx$, $dB_z/dx$ and $dB_z/dy$.

Furthermore, the magnitude and direction characteristics of the current in the circuit below the measurement point are determined by applying Maxwell's law J=Rot B where J is the current vector and B is the magnetic field vector.

During step 766, the values from the signal processing step 764 and the values obtained following the simulation carried out during step 752 are compared in order to deduce whether the real operation of the circuit is correct or not and determine the zones of discrepancy between the theoretical circuit and the real circuit during operation.

Figure 9:
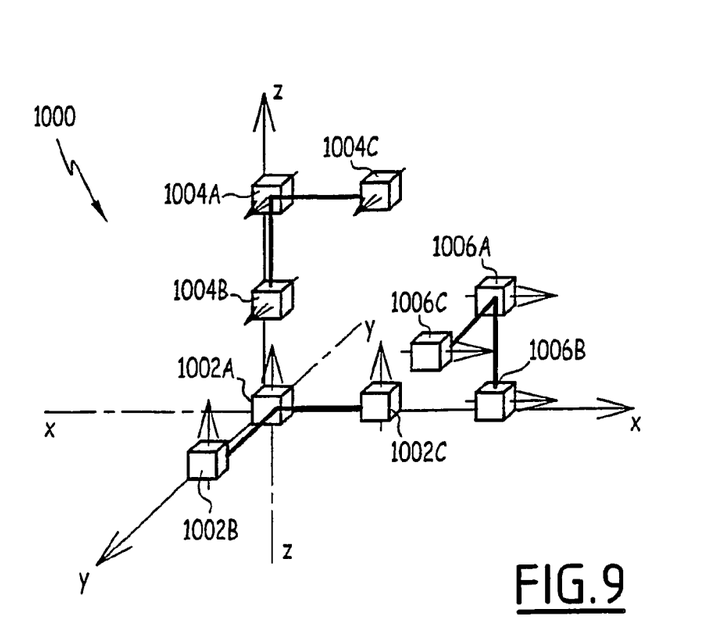
FIG. 9 is a three-dimensional representation of a probe having 9 sensors which are suitable for measuring the field variations in three spatial directions.

The measurement head 724 is constituted, for example, by a probe 1000 as illustrated in FIG. 9. This probe is suitable for carrying out a differential measurement of the field in three perpendicular directions in pairs.

A probe of this type comprises nine sensors. These nine sensors are distributed in the form of three triplets of sensors, the sensors of the same triplet having their selected measurement axes arranged parallel with each other. These sensors are further offset from each other in two directions which are perpendicular relative to the selected measurement axis which characterises the triplet.

More precisely, in the example illustrated in FIG. 9, three sensors 1002A, 1002B, 1002C have their selected measurement axes arranged parallel with the axis X-X. These sensors 1002A, and 1002B are offset relative to each other along the axis X-X whilst the sensors 1002A and 1002B are offset along the axis X-X. In the same manner, the sensors 1004A, 1004B, 1004C have their selected measurement axis parallel with the axis Y-Y, the sensor 1004C being offset from the sensor 1004A along the axis X-X whilst the sensor 1004B is offset from the sensor 1004A along the axis Z-Z. Finally, the three sensors 1006A, 1006B, 1006C have their measurement axis extending parallel with the axis X-X, the sensors 1006A and 1006B being offset relative to the sensor 1006A along the axis Z-Z and along the axis Y-Y, respectively.

In the installation described with reference to FIGS. 7 and 8, each sensor is connected to a specific processing chain and the nine field values are supplied to the processing means 718. Furthermore, the processing means 718 know the distance which separates the various sensors of the same triplet in the directions which are perpendicular relative to the selected measurement axes of the sensors of this triplet. In this manner, for each measurement point, the processing means determine, from the components measured by the sensors, the variation of each component of the magnetic field in each of the directions. Based on these different variations, the various components designated $j_x$, $j_y$ and $j_z$ in the three perpendicular directions X-X, Y-Y and Z-Z of the current flowing in the circuit C which is being tested are calculated using the following ratio:

$$J_x = \frac{dB_z}{dy} - \frac{dB_y}{dz}$$
$$J_y = \frac{dB_x}{dz} - \frac{dB_z}{dx}$$
$$J_z = \frac{dB_y}{dx} - \frac{dB_x}{dy}$$

It is envisaged that, with a device of this type, the current flowing in the circuit can be determined in a precise manner for each measurement point. By multiplying the measurement points, the structure of the circuit being tested can be reconstituted and the dynamic operation thereof can be analysed in a precise manner.

Figure 10:
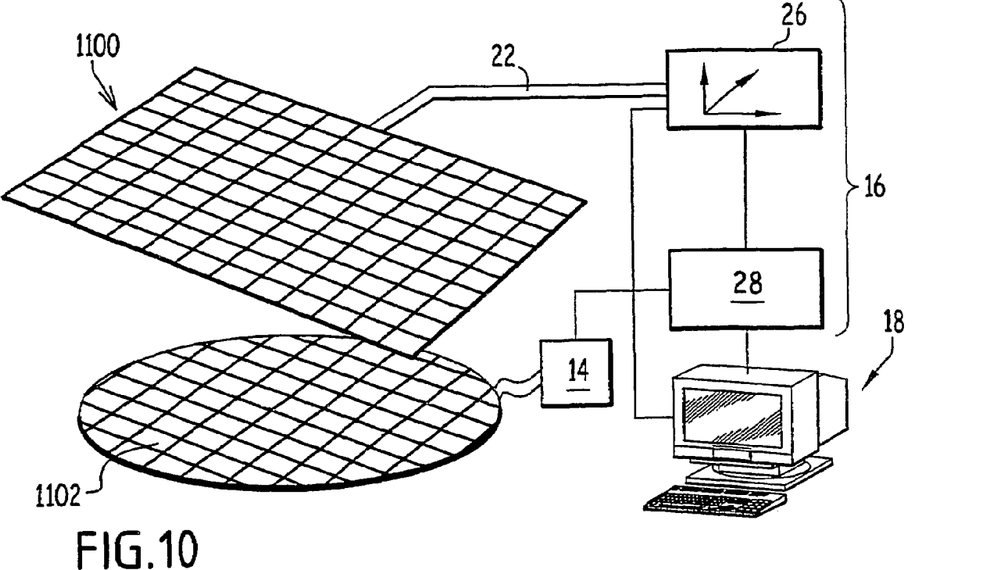
FIG. 10 is a test installation for a set of integrated circuits.

FIG. 10 illustrates a variant of FIG. 7. In this embodiment, the measurement head 724 is replaced by a matrix 1100 comprising a set of sensors which are arranged in a regular manner in the form of a rows and columns. This matrix of sensors allows a set of integrated circuits carried by a silicon wafer 1102 to be tested, the circuits being arranged side by side. The matrix of sensors comprises sets of sensors which are distributed in rows and columns and which each correspond to a circuit to be tested belonging to the wafer 1102.

Figure 11:
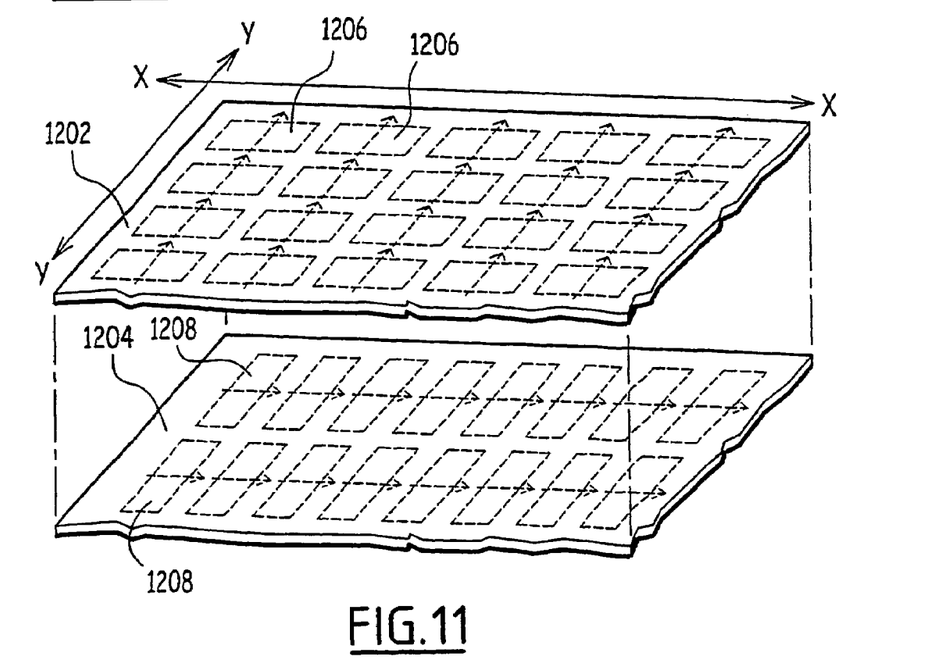
FIG. 11 is a schematic view of a first embodiment of a matrix measurement probe.

A set of sensors is partially illustrated in FIG. 11. Such a set of sensors comprises, for example, 5000 magnetoresistive sensors which are themselves arranged in rows and columns. Each of these sensors is connected to the analysis device by means of a specific processing circuit. The sets of sensors comprise sensors whose selected measurement axes are arranged parallel with each other in two directions which are perpendicular relative to each other. These perpendicular directions extend in a plane parallel with the general plane of the circuits to be tested. The component of the current perpendicular relative to the main plane of the circuit is generally of little interest.

This matrix is used in order to rapidly acquire an image of the magnetic field of a wafer of integrated circuits. For a matrix of a given size, the sensors will be distributed over two planes, one plane in direction X and the other plane in direction Y.

Advantageously, a second matrix which is identical to the one above is used, rotated through 90°. The lower plane, previously X, becomes the plane Y and the upper plane becomes plane X. By using these two matrices, an assembly for measuring field X and field Y at two given altitudes Z is provided. By combining these measurements in a differential manner between the two altitudes, the expression of the current in accordance with Maxwell's equations is obtained.

In the embodiment of FIG. 11, the sensor matrix comprises two superimposed layers 1202, 1204. Each layer comprises a regular network of magnetoresistive sensors. The sensors 1206 of the first layer are arranged with their selected measurement axes parallel, the sensors being distributed in rows and in columns which are perpendicular relative to each other. In the same manner, the second layer comprises sensors 1208 whose selected measurement axes are parallel with each other and perpendicular relative to the measurement axes of the sensors of the first layer.

On the two layers, the sensors are spaced-apart from each other in a direction which is perpendicular relative to their selected measurement axis and which extends in the plane of the layer which carries the sensors of a known predetermined pitch. In this manner, in the example in question, in the region of each sensor, the processing means determine the components $j_x$ and $j_y$ of the current flowing in the main plane of the circuit based on the following ratios:

$$J_x = -\frac{dBy}{dz}$$
$$J_y = \frac{dBx}{dz}$$

In order to obtain these values, the matrix is brought successively into two separate spacing positions in the direction Z-Z relative to the circuit to be tested. Measurements are carried out in these two positions which are separated by a spacing $d_z$ and the quantities $dB_y$ and $dB_x$ are calculated by subtracting the values measured.

Figure 12:
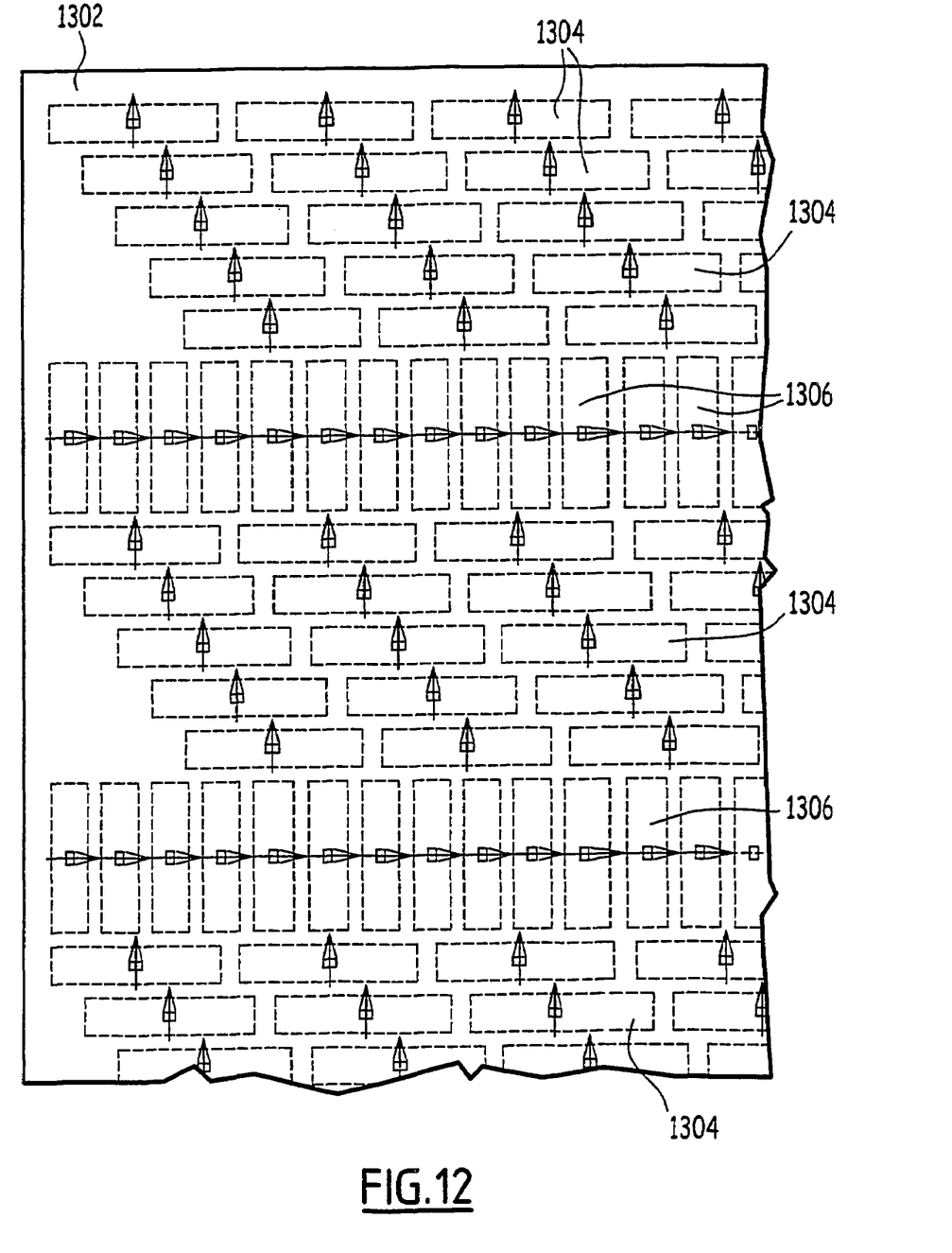
FIG. 12 is a schematic view of a second embodiment of a matrix measurement probe.

FIG. 12 illustrates another embodiment of a probe according to the invention, this probe constituting a set of sensors of the sensor matrix 1100 of FIG. 10.

In this embodiment, the various magnetoresistive sensors are defined on the same layer 1302 of a super-conductive material. Each sensor has a rectangular form, the magnetoresistive element being formed only by the central portion of the sensor illustrated with a square in the Figure.

This probe is constituted by an alternate arrangement of a plurality of rows of sensors which have a selected measurement axis arranged in a first direction X-X and a row of sensors whose selected measurement axis extends along an axis Y-Y. More precisely, five rows of magnetoresistive sensors 1304 having their selected measurement axes parallel with the axis X-X are arranged in sequence along the axis X-X. The sensors are offset from one row to another by a distance equal to $\frac{1}{5}^{th}$ of the length of a magnetoresistive sensor, the length being taken perpendicularly relative to the selected measurement axis. The row of sensors designated 1306 whose selected measurement axis is orientated in the other measurement direction is constituted by an alignment of magnetoresistive sensors which are strictly aligned along the same axis.

This configuration takes into account the rectangular nature of the magnetoresistive sensors. In accordance with the size of the rectangle relative to the active field measurement element located at the centre of the rectangle, the ratio $\frac{1}{5}$ is modified.

Advantageously, a second matrix is arranged so as to be parallel in a plane above the first. This second matrix is organised in a comparable manner but, alternatively, the set of sensors along the axis Y-Y is positioned above the set of sensors along the axis X-X and the sensors along the axis X-X above the sensors along the axis Y-Y. In this manner, a differential measurement between the sensors along the axis X-X between the two planes is obtained after scanning. The differential measurement is carried out in pairs between two measurements of a sensor along the axis X-X of a lower plane at a given location and a sensor along axis X-X of the upper plane at the same location. After scanning, the whole surface is covered by a measurement of the fields $B_X$ and $B_Y$ on two planes (two altitudes z) at all points.

In a variant, the magnetoresistive sensors are replaced with magnetoinductive sensors.

The invention claimed is:

1. A device for analyzing an electrical current during operation, comprising:
   at least one probe (12) for measuring a magnetic field comprising at least two magnetoresistive or magnetoinductive sensors (14, 16) which are sensitive to the magnetic field along a selected measurement axis, said two magnetoresistive or magnetoinductive sensors (14, 16) being rigidly connected to each other in a position such that their selected measurement axes are parallel and offset relative to each other in a transverse direction relative to their selected measurement axes, the probe comprising output terminals which are specific to each magnetoresistive or magnetoinductive sensor in order to provide a signal which is representative of the magnetic field measured by each sensor along the selected measurement axis thereof;
   a processing chain (20, 22) which is specific to each magnetoresistive or magnetoinductive sensor (14, 16);
   means (24, 26) for processing the signals from the various processing chains, which processing means comprising means for evaluating a difference between the field values measured by two magnetoresistive or magnetoinductive sensors having selected measurement axes which are parallel and which are offset transversely relative to each other; and
   means for evaluating a ratio between said difference and a distance separating the two magnetoresistive or magnetoinductive sensors.

2. The device according to claim 1, wherein the device comprises at least two pairs of magnetoresistive or magnetoinductive sensors (602, 604, 606, 608, 610, 612), the sensors of each same pair having their selected measurement axes parallel and offset relative to each other in a transverse direction relative to their selected measurement axes and the selected measurement axes of the sensors of two separate pairs are angularly offset.

3. The device according to claim 2, wherein the device comprises at least nine magnetoresistive or magnetoinductive sensors (1002A, 1002B, 1002C, 1004A, 1004B, 1004C, 1006A, 1006B, 1006C) which are distributed in three triplets of three sensors, the three sensors of the same triplet having their selected measurement axes parallel and offset relative to each other in transverse directions relative to their selected measurement axes and the selected measurement axes of the sensors of separate triplets are angularly offset.

4. The device according to claim 3, wherein all the magnetoresistive or magnetoinductive sensors (602, 604, 606, 608; 1206, 1208) of the probe are distributed in accordance with two layers (1202, 1204).

5. The device according to claim 4, wherein the selected measurement axes of the sensors of different layers are angularly offset.

6. The device according to claim 5, wherein the sensors (1206, 1208) of the same layer have their selected measurement axes parallel.

7. The device probe according claim 1, wherein all the magnetoresistive or magnetoinductive sensors (1304, 1306) of the probe are distributed on the same layer.

8. The device according to claim 1, wherein the device comprises means (26) for displaying the ratio of the difference between the field values measured by the two magnetoresistive or magnetoinductive sensors (14, 16) having selected measurement axes which are parallel and which are offset transversely at the distance separating the two magnetoresistive or magnetoinductive sensors, and in that the device is suitable for being held by hand and manually displaced.

9. The device according to claim 1, wherein the processing means are capable of evaluating, for each pair of sensors (602, 604, 606, 608), the ratio of the difference between the field values measured by two magnetoresistive or magnetoinductive sensors having selected measurement axes which are parallel and which are offset transversely to the distance separating the two magnetoresistive or magnetoinductive sensors and the processing means are capable of calculating at least one component of the current from the difference between the evaluated ratios.

10. The device according to claim 9, wherein the device comprises means (26) for displaying at least one calculated component of the current, and in that the device is suitable for being held by hand and manually displaced.

11. The device according to claim 1, wherein the two sensors are arranged on an integrated circuit.

12. The device according to claim 1, wherein the device comprises means for supplying a sinusoidal signal of a predetermined frequency to each magnetoresistive or magnetoinductive sensor, the processing chain comprising an isolation means of a band pass type centered on a predetermined frequency.

13. The device according to claim 1, wherein said ratio is a current value flowing in an electrical circuit in a first direction, the field values being the field values of magnetoresistive or magnetoinductive sensors having selected measurement axes extending along a second direction, the second direction being perpendicular to the first direction.

14. The device according to claim 1, wherein a value of current Jy flowing through an electrical circuit in a direction Y-Y is based on a ratio:

$$\frac{dB_x}{dz} = \frac{B_{x2} - B_{x1}}{z_2 - z_1}$$

where B is the magnetic field, $X_2$ and $X_1$ are positions of components of the magnetic field along axis X-X, and $Z_2$ and $Z_1$ are positions of the sensors 14 and 16 along axis Z-Z.

* * * * *